United States Patent
Gille et al.

(10) Patent No.: US 9,349,934 B2
(45) Date of Patent: May 24, 2016

(54) METHOD FOR MANUFACTURING A THERMOELECTRIC DEVICE, ESPECIALLY INTENDED TO GENERATE AN ELECTRICAL CURRENT IN AN AUTOMOTIVE VEHICLE

(75) Inventors: Gerard Gille, Thorigne-en-Charnie (FR); Patrick Boisselle, Laval (FR); Didier Pottier, L'Huisserie (FR); Veronique Monnet, Change (FR)

(73) Assignee: VALEO SYSTEMES THERMIQUES, Le Mesnil Saint Denis (FR)

( * ) Notice: Subject to any disclaimer, the term of this patent is extended or adjusted under 35 U.S.C. 154(b) by 505 days.

(21) Appl. No.: 13/876,702

(22) PCT Filed: Jul. 28, 2011

(86) PCT No.: PCT/EP2011/063026
§ 371 (c)(1),
(2), (4) Date: Aug. 1, 2013

(87) PCT Pub. No.: WO2012/041560
PCT Pub. Date: Apr. 5, 2012

(65) Prior Publication Data
US 2013/0309798 A1    Nov. 21, 2013

(30) Foreign Application Priority Data

Sep. 29, 2010 (FR) ...................... 10 57877

(51) Int. Cl.
*H01S 4/00*      (2006.01)
*H01L 35/34*     (2006.01)
(Continued)

(52) U.S. Cl.
CPC ................ *H01L 35/34* (2013.01); *H01L 35/30* (2013.01); *F28F 1/32* (2013.01); *Y10T 29/49002* (2015.01)

(58) Field of Classification Search
CPC ......... H01L 35/30; H01L 35/34; H01L 27/16; F28D 15/0275; B60H 2001/2275; Y10S 257/93; F01N 5/025; Y10T 29/49002

USPC ........... 29/592.1, 726, 832, 846, 888, 890.03, 29/890.031; 180/65.26, 68.3, 309

See application file for complete search history.

(56) References Cited

U.S. PATENT DOCUMENTS 5,584,183 A    12/1996  Wright et al.
8,100,216 B2 *  1/2012  Bartilson ................. B60K 6/46
                                                        180/309

(Continued)

FOREIGN PATENT DOCUMENTS

EP          1515376 A2      3/2005
WO     WO 96/11372 A1       4/1996

(Continued)

OTHER PUBLICATIONS

English language abstract for EP 1515376 extracted from the espacenet.com database on Jun. 7, 2013, 9 pages.

(Continued)

*Primary Examiner* — Thiem Phan
(74) *Attorney, Agent, or Firm* — Howard & Howard Attorneys PLLC

(57) ABSTRACT

The invention relates to a method for manufacturing a thermoelectric device, comprising a first circuit (1), called hot circuit, through which a first fluid can flow, and a second circuit (2), called cold circuit, through which a second fluid can flow at a temperature lower than that of the first fluid, elements (3p, 3n), called thermoelectric elements, that can be used to generate an electric current in the presence of a temperature gradient, fins (5) in a heat exchange relationship with said hot circuit (1) and/or said cold circuit (2), the thermoelectric elements (3p, 3n) being in contact at least with said fins (5). According to the method according to the invention, said fins (5) are compressed in order to ensure that said thermoelectric elements (3p, 3n) are held against said fins (5).

15 Claims, 5 Drawing Sheets

(51) Int. Cl.
*H01L 35/30* (2006.01)
*F28F 1/32* (2006.01)

(56) References Cited

U.S. PATENT DOCUMENTS

| | | |
|---|---|---|
| 2005/0087222 A1 | 4/2005 | Muller-Werth |
| 2007/0220902 A1 | 9/2007 | Matsuoka et al. |
| 2011/0154811 A1 | 6/2011 | Simonnin |

FOREIGN PATENT DOCUMENTS

| | | |
|---|---|---|
| WO | WO 2009/156361 A1 | 12/2009 |
| WO | WO 2012/041559 A1 | 4/2012 |
| WO | WO 2012/041561 A1 | 4/2012 |
| WO | WO 2012/041562 A1 | 4/2012 |
| WO | WO 2012041558 A1 | 4/2012 |

OTHER PUBLICATIONS

English language abstract for WO 2009/156361 extracted from the espacenet.com database on Jun. 7, 2013, 40 pages.
English language abstract and machine-assisted English translation for WO 2012041558 extracted from the espacenet.com database on Jun. 10, 2013, 43 pages.
English language abstract and machine-assisted English translation for WO 2012041559 extracted from the espacenet.com database on Jun. 10, 2013, 46 pages.
English language abstract and machine-assisted English translation for WO 2012041561 extracted from the espacenet.com database on Jun. 11, 2013, 42 pages.
English language abstract and machine-assisted English translation for WO 2012/041562 extracted from the espacenet.com database on Jun. 11, 2013, 52 pages.
International Search Report for Application No. PCT/EP2011/063021 dated Aug. 17, 2011; 5 pages.
International Search Report for Application No. PCT/EP2011/063025 dated Aug. 29, 2011; 5 pages.
International Search Report for Application No. PCT/EP2011/063026 dated Aug. 17, 2011; 5 pages.
International Search Report for Application No. PCT/EP2011/063029 dated Aug. 29, 2011; 5 pages.
International Search Report for Application No. PCT/EP2011/063033 dated Aug. 29, 2011; 7 pages.

* cited by examiner

METHOD FOR MANUFACTURING A THERMOELECTRIC DEVICE, ESPECIALLY INTENDED TO GENERATE AN ELECTRICAL CURRENT IN AN AUTOMOTIVE VEHICLE

RELATED APPLICATIONS

This application is the National Stage of International Patent Application No. PCT/EP2011/063026, filed on Jul. 28, 2011, which claims priority to and all the advantages of French Patent Application No. FR 10/57877, filed on Sep. 29, 2010, the content of which is incorporated herein by reference.

The present invention relates to a method for manufacturing a thermoelectric device, intended in particular to generate an electric current in a motor vehicle.

BACKGROUND

Thermoelectric devices have already been proposed that use elements, called thermoelectric elements, that can be used to generate an electric current in the presence of a temperature gradient between two of their opposing faces through the phenomenon known as the Seebeck effect. These devices comprise a stack of first pipes, intended for the circulation of the exhaust gases from an engine, and second pipes, intended for the circulation of a heat-transfer fluid of a cooling circuit. The thermoelectric elements are sandwiched between the pipes so as to be subjected to a temperature gradient originating from the temperature difference between the hot exhaust gases and the cold coolant.

Such devices are particularly interesting because they make it possible to produce electricity from a conversion of the heat originating from the exhaust gases of the engine. They thus offer the possibility of reducing the fuel consumption of the vehicle by replacing, at least partially, the alternator usually provided therein in order to generate electricity from a belt driven by the crankshaft of the engine.

One drawback of the known devices is that they require a very good contact to be ensured between the thermoelectric elements and the pipes. It is thus necessary to have pipes that have a flatness and a surface finish that have an impact on the cost price of the device.

A first solution, consisting in reinforcing the contact by virtue of tie rods exerting a force on the stack of pipes, has been tested. This solution does, however, entail using pipes that do not present a risk of being crushed on one another under the effect of this force, resulting in an overconsumption of material.

Another difficulty encountered with such devices is that, on the hot pipe side, the thermoelectric elements are subjected to high temperatures whereas, on the cold pipe side, the temperatures are much lower. The requirements concerning the connection to be made between the thermoelectric elements and the pipes are therefore very different in nature on the hot pipes side and cold pipes side.

SUMMARY OF THE INVENTION

By associating the thermoelectric elements with fins, the intimacy of the contact is facilitated. In practice, the need to establish a close link between the thermoelectric elements and the component or components creating the temperature gradient is necessary to their operation is no longer supported solely by the fluid circulation pipes but by a specific component, the fins, which can therefore be chosen for this purpose. The technical solutions used to establish an effective heat bridge between, on the one hand, the fins and the hot and/or cold circuits and, on the other hand, the fins and the thermoelectric elements, will therefore be able to be optimized separately, at least for one of the circuits.

Furthermore, according to the method according to the invention, said fins are compressed in order to ensure that said thermoelectric elements are held against said fins. A link by simple contact between the thermoelectric elements and the components of the device can thus be ensured. It is thus no longer necessary to provide a link mode, such as bonding and/or soldering, suited to the stresses encountered by said components.

According to different embodiments:
said first circuit comprising pipes, called hot pipes, for the circulation of the first fluid, it is ensured that said thermoelectric elements are held between said hot pipes and said fins,
the thermoelectric elements are positioned on a mounting support, then said mounting support is positioned relative to said hot pipes,
one said hot pipe, one said mounting support, previously equipped with said thermoelectric elements, one or more said fins and one said mounting support, previously equipped with said thermoelectric elements, are stacked repeatedly,
two said fins are provided between each said mounting support, previously equipped with said thermoelectric elements, and a compressible material is arranged between said two fins,
the cold circuit comprising pipes, called cold pipes, for the circulation of the second fluid, orifices for the passage of the cold pipes are provided in the fins, said cold pipes are introduced into said passage orifices, and the pipes and the fins are assembled by mechanical assembly,
the fins 5 are stacked on the cold pipes 9.

BRIEF DESCRIPTION OF THE DRAWINGS

The invention will be better understood in light of the following description which is given purely as an indication and which is in no way intended to limit it, accompanied by the attached drawings in which.

DETAILED DESCRIPTION

Figure 1:
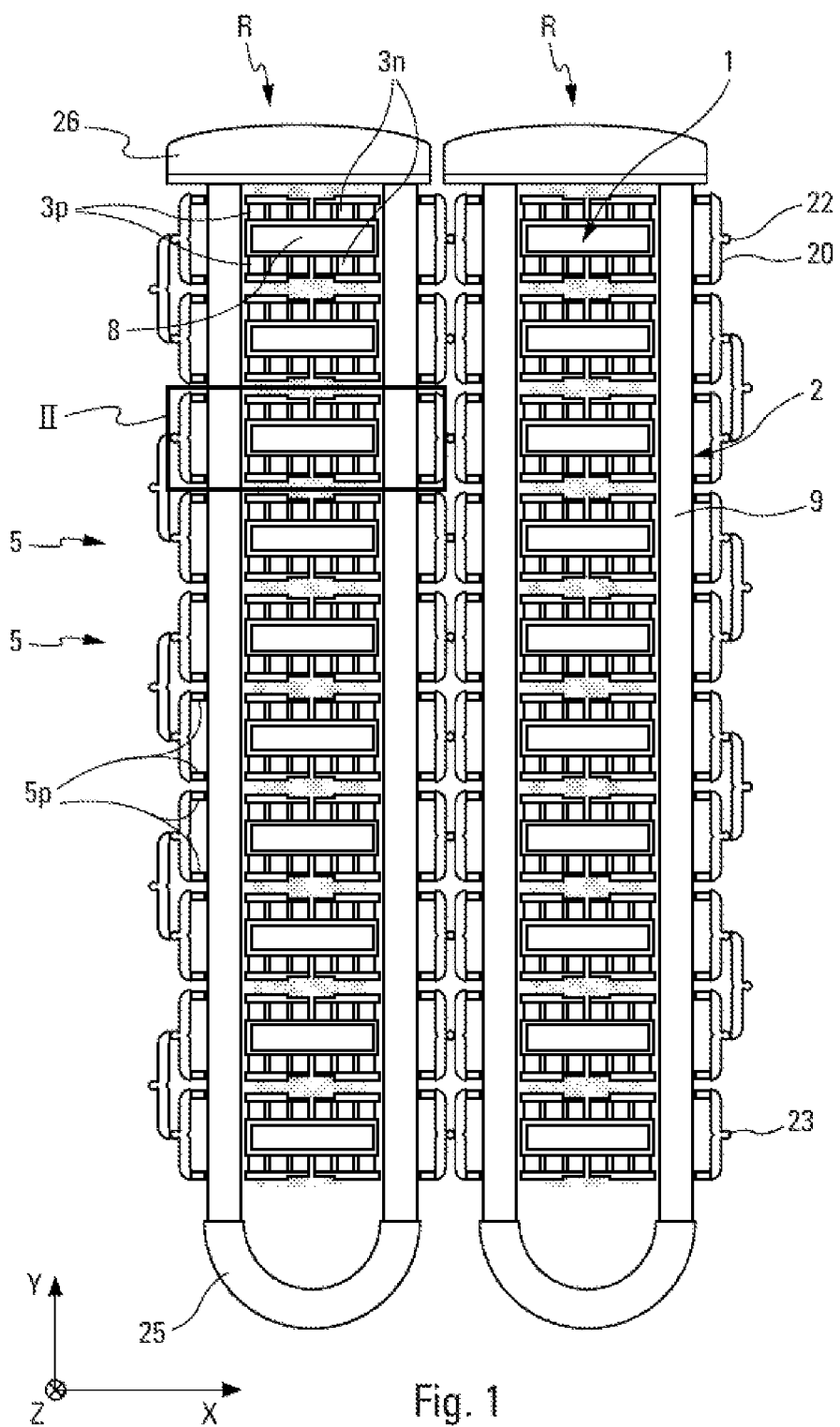
FIG. 1 schematically illustrates, in cross section, a device obtained according to an exemplary implementation of the method according to the invention, the cross section being made in a plane orthogonal to the longitudinal axis of the hot pipes of the device, FIG. 2 details a part referenced II in FIG. 1, FIG. 3 schematically illustrates, in cross section, a device obtained according to a variant embodiment of the method according to the invention, the cross section being made in a plane orthogonal to the longitudinal axis of the cold pipes of the device, some of the elements being represented transparently.

Thermoelectric devices obtained according to exemplary implementations of the method according to the invention will be described first, in relation to FIGS. 1 to 5.

Such thermoelectric devices comprise a first circuit 1, called hot circuit, through which a first fluid can flow, notably exhaust gases of an engine, and a second circuit 2, called cold circuit, through which a second fluid can flow, notably a heat transfer fluid of a cooling circuit, at a temperature lower than that of the first fluid.

The hot circuit comprises, for example, pipes 8, called hot pipes, through which the first fluid can flow, and the cold circuit comprises, for example, pipes 9, through which the second fluid can flow.

The device also comprises elements $3p$, $3n$, called thermoelectric elements, that can be used to generate an electric current in the presence of a temperature gradient.

These are, for example, elements of substantially parallelepipedal form generating an electric current, through the Seebeck effect, when they are subjected to said gradient between two of their opposing faces $4a$, $4b$, called active faces. Such elements can be used to create an electric current in a load connected between said active faces $4a$, $4b$. As is known to the person skilled in the art, such elements are made, for example, of bismuth and of tellurium ($Bi_2Te_3$).

The thermoelectric elements may, for a first part, be elements $3p$ of a first type, called P, making it possible to establish an electrical potential difference in one direction, called positive, when they are subjected to a given temperature gradient, and, for the other part, elements $3n$ of a second type, called N, making it possible to create an electrical potential difference in an opposite direction, called negative, when they are subjected to the same temperature gradient.

The device also comprises fins 5, $5p$, $5n$ configured in a heat exchange relationship with said hot circuit and/or said cold circuit. A temperature gradient is thus ensured between said fins or between the fins 5, $5p$, $5n$ in a heat exchange relationship with one 2 of said circuits and the other circuit 1. The thermoelectric elements $3p$, $3n$ are in contact at least with said fins 5, $5p$, $5n$, notably on their active face $4a$, $4b$. In other words, the thermoelectric elements are arranged either between two fins, or between one of the fins in a heat exchange relationship with one of the circuits and the other circuit, in this case the hot pipes 8. A current generation by the thermoelectric elements is thus assured.

It is therefore the fins 5, $5p$, $5n$ which fulfill the function of establishing the thermal contact with the thermoelectric elements, at least for the cold circuit.

A fin should be understood to be an element having two large planar opposing surfaces $7a$, $7b$ with a thickness very much less than its width and its length, making it possible to establish a surface contact, for example, between one of said large surfaces $7a$ and the thermoelectric elements $3p$, $3n$ on one $4a$ of their opposing faces to be subjected to a temperature gradient to generate an electric current. The fins are formed from a heat-conducting material, notably a metallic material such as copper or aluminum.

In a first embodiment, the fins 5, $5p$, $5n$ are coated with an electrically insulating material and are provided, on their face situated facing the thermoelectric elements, with one or more electrically conductive tracks, not represented, linking, in series and/or in parallel, the thermo-conductive elements arranged on the fin.

According to another embodiment, the fins $5p$, $5n$ contribute by themselves to the conduction of the electricity produced by the thermoelectric elements $3p$, $3n$.

The hot pipes 8 are chosen to be compatible with the flow of stressing fluids, in particular hot and/or corrosive fluids.

The hot pipes 8 will be able to be configured to establish a surface contact with the thermoelectric elements $3p$, $3n$ on their active face $4b$ opposite to that $4a$ in contact with the fins 5, $5p$, $5n$.

On this subject, said hot pipes 8 have, for example, at least one planar face $10a$, $10b$ and said thermoelectric elements 3 are provided on said planar face or faces $10a$, $10b$.

Said hot pipes 8 are, notably, substantially flat pipes comprising two large parallel opposing faces $10a$, $10b$ on which are arranged the thermoelectric elements $3p$, $3n$, for example, by their active face $4b$. They will be able to be configured to allow for the flow of exhaust gas and are, notably, made of stainless steel. They are formed, for example, by profiling, welding and/or hard soldering. They will be able to have a plurality of channels for the passage of the first fluid, separated by partitions 31 (which can be seen in FIGS. 4, $6a$, $6b$ and 7) linking the opposing planar faces $10a$, $10b$ of the pipes. Such partitions 31 make it possible, in particular, to increase the thermal efficiency of the hot pipes 8 and reinforce their resistance to the internal pressure.

The hot pipes 8 are coated on said large faces $10a$, $10b$ with a layer of electrically insulating material and are provided with electrically conductive tracks linking, in series and/or in parallel, all or part of the thermo-conductive elements arranged on the hot pipes 8.

The thermoelectric elements $3p$, $3n$ are, for example, distributed in a number of ranks, parallel to one another and oriented in the longitudinal direction of the hot pipes 8, in other words, according to the axis Z illustrated in the different figures. According to the exemplary embodiments illustrated, six ranks are provided for the exemplary embodiment of FIGS. 1 and 2 and four ranks for the exemplary embodiment of FIGS. 3 and 4. It will obviously be possible to provide different numbers of ranks of thermoelectric elements, and do so regardless of the embodiment involved.

On one and the same face of a hot pipe 8, the thermoelectric elements of one and the same type, P or N, form a group of thermoelectric elements connected in parallel and the two groups of thermoelectric elements are connected in series.

The fins 5, $5p$, $5n$ are arranged, in particular, so as to be substantially parallel to the planar faces $10a$, $10b$ of the hot pipes 8.

They have, for example, orifices 12 for the passage of the cold pipes 9.

Said cold pipes 9 are, for example, made of aluminum or of copper and have a round and/or oval section.

According to the exemplary embodiments illustrated, the hot pipes 8 extend, as already stated, according to an axis identified Z. Their planar faces $10a$, $10b$ and the fins $5p$, $5n$ extend on planar oriented according to the axis Z and an axis X orthogonal to Z. The cold pipes extend in the direction Y at a right angle to the axes X and Z, that is to say, in the direction at right angles to the fins $5p$, $5n$ and to the large faces $10a$, $10b$ of the hot pipes 8.

In the embodiments where the conduction of electricity is produced by the fins, an electrical insulator is provided between the cold pipes 9 and the fins $5p$, $5n$.

Figure 2:
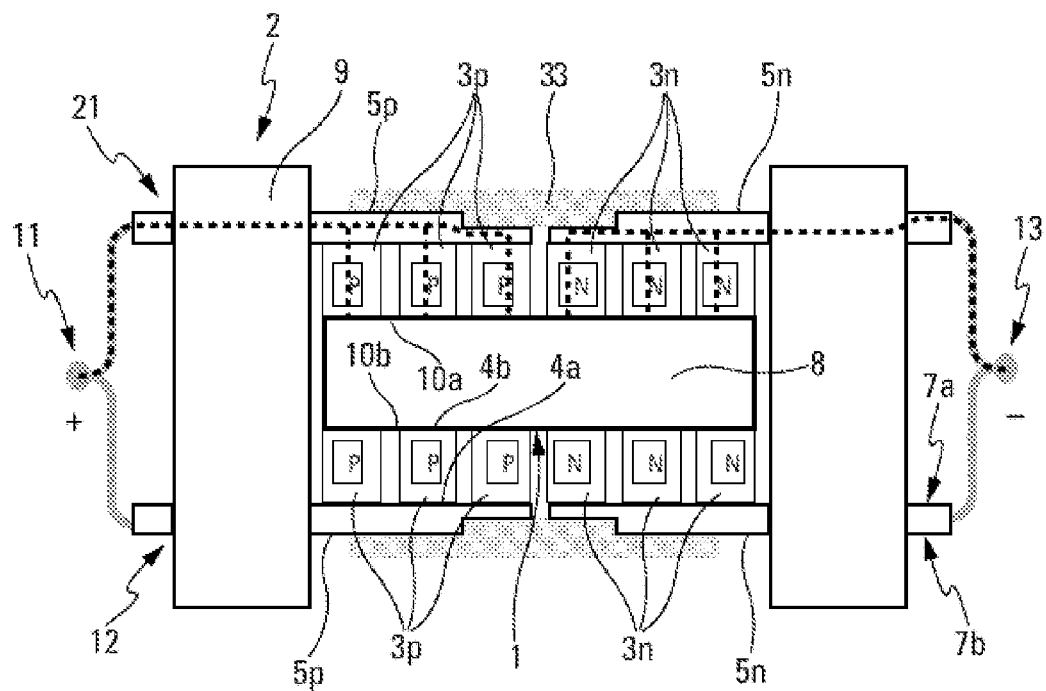

As is more particularly illustrated in FIG. 2, each planar face $10a$, $10b$ of the hot pipes 8 has associated with it, for example, at least two so-called fins $5p$, $5n$, called neighboring fins, provided facing said planar face $10a$, $10b$, and a plurality of said thermoelectric elements $3p$, $3n$ are provided, arranged between the planar face $10a$, $10b$ and the neighboring fins $5p$, $5n$ of said planar face $10a$, $10b$.

The P-type thermoelectric elements 3p of said plurality of thermoelectric elements are provided between a first 5p of said two fins, called P-type fin, and said planar face 10a, 10b, and the N-type thermoelectric elements of said plurality of thermoelectric elements are provided between the other 5n of said two fins, called N-type fin, and said planar face 10a, 10b, so as to create a potential difference between said two fins.

In this figure, each P-type fin 5p is associated with 3 ranks of P-type thermoelectric elements 3p and each N-type fin 5n is associated with 3 ranks of N-type thermoelectric elements 3n.

Figure 4:
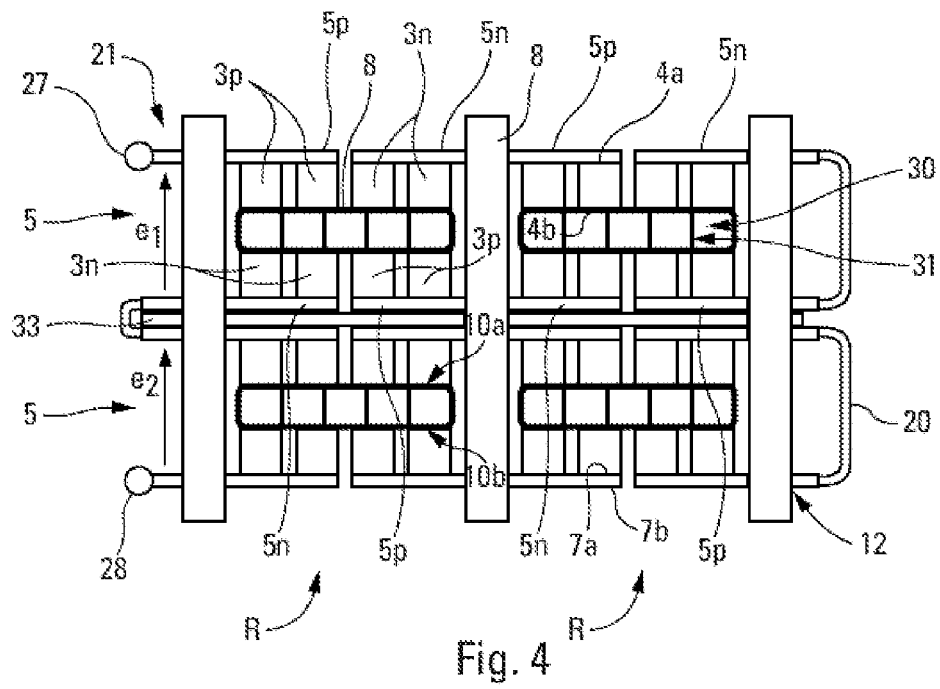
FIG. 4 is a cross-sectional view along the line IV-IV illustrated in FIG. 3.
Figure 5:
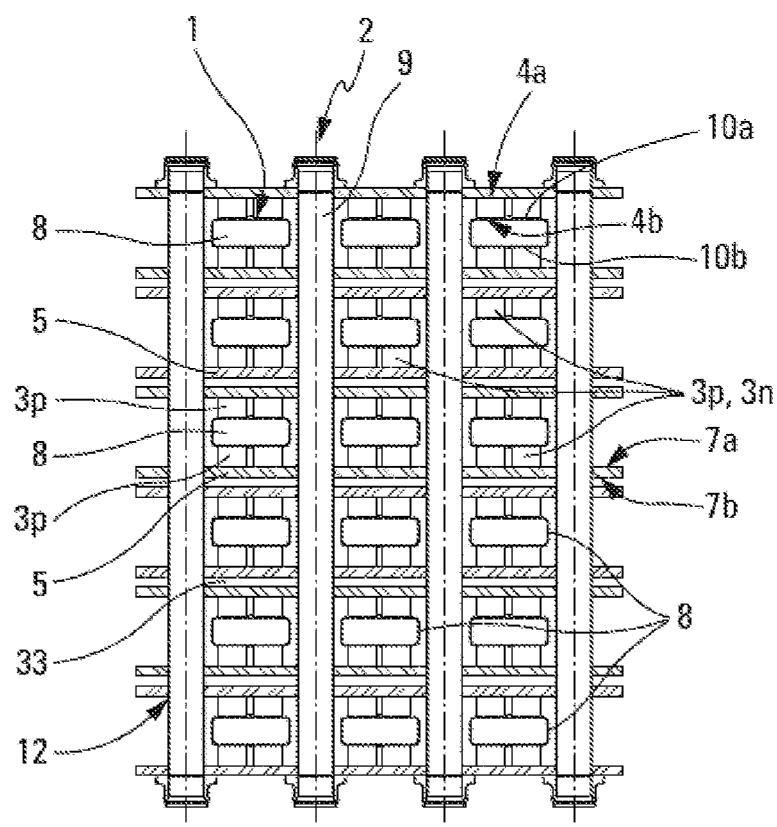
FIG. 5 illustrates another variant embodiment according to the same conditions of implementation as FIG. 1, FIGS. 6a and 6b illustrate, in perspective, mounting steps of the exemplary method, according to the invention, making it possible to manufacture the device illustrated in the preceding FIG. 5, some of the elements being represented transparently.

By referring to FIGS. 1, 4 and 5, it will be observed that said hot pipes 8 will be able to be superposed in a number of ranks R in a first direction Y orthogonal to the fins 5, 5p, 5n.

According to the embodiments illustrated in FIGS. 1 and 4, some of said fins 5p, 5n, called internal fins, are provided between said hot pipes 8, one pair of said internal fins 5p, 5n being located between two successive hot pipes 8 of one and the same rank R. Furthermore, the fins 5p, 5n of one and the same pair 8 are separated by a compressible material 33, which will also be electrically insulating. Such a solution makes it possible to contribute to absorbing the mechanical stresses, generated in particular by the thermal stresses that the pipes 8, 9 are subjected to.

The hot pipes 8 of a so-called rank R are arranged, for example, between two ranks of said cold pipes 9, the cold pipes 9 of a first of said two ranks of cold pipes 9 being in a heat exchange relationship with the fin 5p, 5n provided on a first side of the hot pipes of said rank R and the cold pipes 9 of the second of said two ranks of cold pipes being in a heat exchange relationship with the fins 5p, 5n provided on the other side of the hot pipes 8 of said rank R.

The fins 5, 5p, 5n have, for example, a protruding part 21 on either side of the hot pipes 8, where the cold pipes pass through the orifices 12.

The subassembly consisting of a fin 5p, of one or more P-type thermoelectric elements, of a face 10a or 10b of the hot pipe 8, of one or more N-type thermo elements, and of a fin 5n, defines a basic building block which will be able to be reproduced, the building blocks then being assembled electrically in parallel and/or in series in different ways to allow for the generation of a current exhibiting the desired intensity and/or potential difference.

Figure 7:
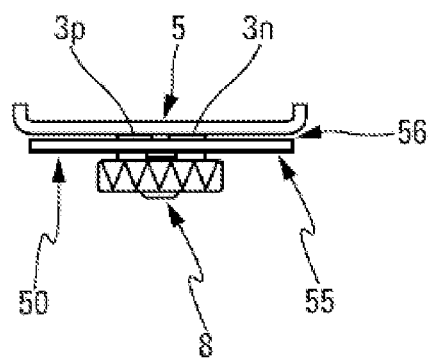
FIG. 7 illustrates, in cross section, a component used in the mounting steps of FIGS. 6a and 6b, the cross section being made in a plane orthogonal to the longitudinal axis of the hot pipes of the device.

It should be noted that, in this basic building block, as a variant, according to the exemplary embodiment of FIGS. 5 to 7, the fin related to the P-type thermoelectric elements and the cold fin related to the N-type thermoelectric elements will be able to consist of one and the same fin 5.

We will now describe an exemplary embodiment of the arrangement of the thermoelectric elements 3p, 3n facing a given hot pipe 8 and the fins 5p, 5n provided to correspond, producing a first assembly of the basic building block described above.

More particularly, if we focus on the embodiment illustrated in FIGS. 1 and 2, it will be observed that said P-type fins 5p are located facing one another on either side of one and the same hot pipe 8 and said N-type fins 5n are located on either side of said same hot pipe 8. Said P-type 5p and N-type 5n fins are respectively connected together electrically so as to set the thermoelectric elements of one and the same type located on either side of said hot pipe 8 to the same potential.

In other words, for one and same hot pipe 8, the P-type thermoelectric elements 3p are situated facing P-type thermoelectric elements on the opposing faces 10a, 10b of the pipe and the N-type thermoelectric elements 3n are situated facing N-type thermoelectric elements 3n on the opposing faces 10a, 10b of the pipe.

For one and the same rank R of hot pipes 8, the P-type fins 5p are all in a heat exchange relationship, for example, with one and same rank of said cold pipes 9 whereas the N-type fins 5n are all in a heat exchange relationship with one and the same other rank of said cold pipes 9.

Moreover, in the case of the use of fins 5p, 5n associated in pairs, the fins 5p, 5n of one of the same pair are of the same type, P or N.

In this configuration, assuming that the positive 11 and negative 13 terminals illustrated in FIG. 2 are linked to a load, it can be considered that the thermoelectric elements associated with the hot pipe 8 generates, for each face 10a, 10b of a so-called hot pipe 8, a current flowing in the following manner, as illustrated by the dotted lines in FIG. 2. The current passes through the P-type fin 5p associated with this face and linked to the positive terminal 11, passes through the P-type thermoelectric elements 3p then via the tracks provided on the pipe to the N-type thermoelectric elements 3n situated on the same face to continue via the N-type fin 5n, linked to the negative terminal 13, to create a potential difference between the positive 11 and negative 13 terminals. The thermoelectric elements situated on either side of the hot pipe 8 are mounted in parallel, thus delivering two times more current than in the case of a series assembly (see embodiment of FIGS. 3 and 4).

The hot pipes 8 will be able to be situated facing one another from one rank R of hot pipes to the other so as to form a series S of hot pipes 8 located in the extension of one another in a direction of transversal extension X of the fins 5p, 5n.

The fins 5p, 5n of one and the same type, P or N, located on either side of one and the same hot pipe 8 of a rank R of hot pipes are situated facing fins 5p, 5n of one and the same type, P or N, located on either side of the hot pipe 8 situated opposite in the rank R of neighboring hot pipes, in one and the same series S of hot pipes.

Said fins 5p, 5n of one and the same type located on either side of one and the same hot pipe 8 of a rank R of hot pipes and the fins 5p, 5n situated in extension in the rank R of neighboring hot pipes 8 will then be able to be set to the same potential.

In one and the same series S of hot pipes, said fins 5p, 5n of one and the same type located on either side of one and the same hot pipe 8 of a rank R of hot pipes and the fins situated facing one another in the rank R of neighboring hot pipes are, for example, respectively, fins of different type, P or N. In other words, the P-type fins 5p are facing N-type fins 5n in the direction X, from one rank R of hot pipes to the other.

The fins 5p, 5n located on either side of one and the same hot pipe 8, situated at the end of a series S of hot pipes, are set to the same potential as the fins 5p, 5n situated at the end of the neighboring series S of hot pipes, on one side of said series S of hot pipes.

In the exemplary embodiment illustrated, the series S are electrically connected in series from one series to the other, by their fins 5p, 5n located on either side of the hot pipe 8 situated at the end of the series S. The device has two positive 22 and negative 23 electrical connection terminals, respectively provided on the fins, notably P-type 5p, of the hot pipe 8 located at one of the ends of the first series S, in the direction Y of the ranks R of hot pipes, and on the fins, notably P-type 5p, of the hot pipe 8 located at one of the ends of the last series S, in the direction Y, of the ranks R of hot pipes.

The thermoelectric elements 3p, 3n are thus electrically associated in parallel on one and the same hot pipe 8, as already stated, then in series from one hot pipe 8 to the other in the same series S of hot pipes and from one series S to the other. The potential difference that exists between the positive 22 and negative 23 terminals is thus the resultant of the potential difference created on each hot pipe 8. In this way, the greater the number of ranks R and series S of hot pipes, the higher the potential difference created at the terminals of the device. The greater the number of thermoelectric elements associated with each pipe, the greater the intensity of the current that the device can deliver.

Two ranks of cold pipes 9 are, for example, provided between each rank R of hot pipes 8. Said cold pipes 9 provided on either side of one and the same rank R of hot pipes will be able to be linked together by a bent part 25 and form fluid circulation hairpins linked to collecting boxes 26. Each box is divided into two volumes, a first fluid inlet volume linked to one of the cold pipes and a second fluid outlet volume linked to the other cold pipe.

The hot pipes are linked, at each of their ends, to a collecting box, which is not represented.

Figure 3:
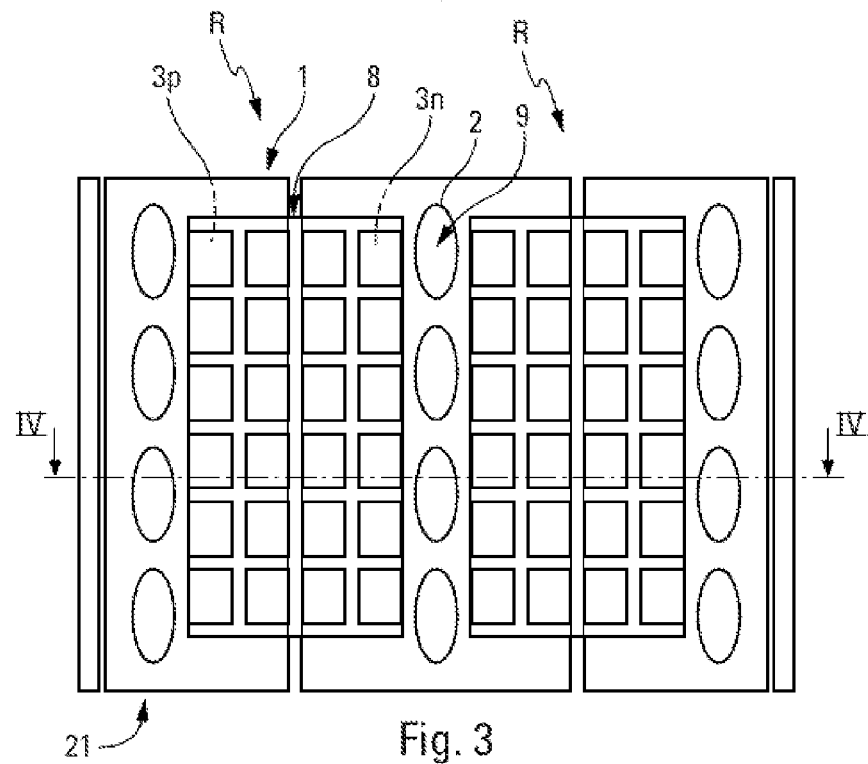

With reference now to the embodiment of FIGS. 3 and 4, there will be observed that, according to another electrical connection example, said P-type fins $5p$ are located facing said N-type fins $5n$ on either side of one and the same hot pipe 8. In other words, the P-type thermoelectric elements $3p$ are situated facing N-type thermoelectric elements $3n$ on the opposing faces $10a$, $10b$ of the hot pipe 8.

In such an embodiment, in the case of use of fins associated in pairs, the fins of one and the same pair are of different types, one P-type and the other N-type, or vice versa.

Here again, the hot pipes 8 are situated facing one another from one rank R of hot pipes to the other so as to form a series S of hot pipes located in the extension of one another in the direction X of transversal extension of the fins $5p$, $5n$. On the other hand, the P-type fins $5p$, respectively N-type $5n$, of a so-called hot pipe are merged with the N-type fins $5n$, respectively P-type $5p$, of the hot pipe of the neighboring rank R, in the same series S of hot pipes.

The fins $5p$, $5n$ located on either side of the hot pipe 8 situated at the end of a series S of hot pipes are electrically connected together in series.

The fins $5p$, $5n$ located on either side of one and the same hot pipe 8, situated at the end of a series S of hot pipes, are set to the same potential, on one side of the series S of hot pipes and the fins $5p$, $5n$ located on either side of one and the same hot pipe 8, situated at the other end of the series S of hot pipes, are set to the same potential as the fins $5p$, $5n$ of the neighboring hot pipe of the preceding and/or next series S of hot pipes.

In other words, in one and the same series S of hot pipes, the fins $5p$, $5n$ are mounted in series, a potential difference $e1$, $e2$ being created, on the side of the series S of hot pipes where the two fins not connected together are located, between said two fins that are not connected together. Also, the different series S of hot pipes are connected in series together.

The potential difference that exists between the positive 27 and negative 28 terminals is the resultant of the potential difference created on each hot pipe 8, which corresponds to the sum of the potential differences created on each of its faces $10a$, $10b$. Thus, the greater the number of ranks R and series S of hot pipes, the higher the potential difference created at the terminals of the device. The greater the number of thermoelectric elements associated with each fin, the greater the intensity of the current that the device can deliver.

In this embodiment, a single rank of cold pipes 9 is provided between each rank R of hot pipes.

The hot and cold pipes are respectively linked to collecting boxes, which are not represented.

That said, it will be possible to provide for the fins $5p$, $5n$ to have a reduced thickness on moving away from the cold pipe 9 with which they are in contact. There may be fins with two thicknesses, one greater on the ranks of thermoelectric elements $3p$, $3n$ closest to the cold pipe 9 and one lesser on the ranks of thermoelectric elements $3p$, $3n$ furthest away from the cold pipe 9. Such an arrangement makes it possible to have a more constant heat exchange on each rank of thermoelectric elements $3p$, $3n$.

As already mentioned, in the embodiments of FIGS. 1 to 4, the cold fins $5f$-$p$, $5f$-$n$ provided facing one and the same planar face $10a$ or $10b$ are two distinct components. In other words, two distinct fins are provided facing each face $10a$, $10b$ of one and the same hot pipe 8. In the variant of FIGS. 5 to 7, these fins consist of one and the same component 5. In other words, a single fin 5 is provided facing each of the faces of one and the same pipe 8. In such a variant, it is not the fins 5 that conduct the electricity generated by the thermoelectric elements, but necessarily the tracks, provided on their surface, in contact with said elements. More specifically, the tracks in contact with the P-type thermoelectric elements are distinct from tracks in contact with the N-type thermoelectric elements in order to avoid any short circuit. In such a variant, in the case of use of a number of hot pipes 8 situated in the extension of one another in one and the same series S, it will be possible to provide a fin 5 common to all these hot pipes 8, for each of their faces $10a$, $10b$, the tracks being configured on each of the fins to set the thermoelectric elements of the same type, P or N, of neighboring hot pipes 8 to the same potential.

In the above, the expression "electrically connected" or "set to the same potential" should be understood to mean that the fins are connected to one another in the case where it is they which conduct the electricity or that the tracks provided on the fins are connected together from one fin to the other when the fins are provided with conducting tracks, for example using connection lugs and electrical conductors 20.

That said, according to the method according to the invention, said fins 5, $5p$, $5n$ are compressed to ensure that said thermoelectric elements $3p$, $3n$ are held against said fins 5. The tensioning of the fins makes it possible to ensure that the thermoelectric elements are held and in contact between the fins, in the case of devices with cold side and hot side fins, or between the fins and the pipes, in the case of devices, such as those illustrated, with cold side fins 5, $5p$, $5n$ and hot side pipes 8. It is even possible in this way to avoid using a binder, such as glue or soldering, the thermoelectric elements remaining in place under the simple action of the compression provided by the fins 5, $5p$, $5n$, after they have been tensioned.

As illustrated in FIG. 7, it will be possible to position the thermoelectric elements $3p$, $3n$ on a mounting support 50 then to position said mounting support relative to said hot pipes 8. Said support 50 takes the form, for example, of a plate pierced with holes 51 into which the thermoelectric elements $3p$, $3n$ are introduced. The holes 51 are distributed to correspond to the distribution desired for the thermo elements $3p$, $3n$, in other words, in rows and/or in columns.

This support 50 makes it possible to hold the thermoelectric elements in place until the fin tensioning step. It also facilitates automating their positioning and their indexing, for example, relative to the pipes 8.

It also offers the advantage of forming a thermal screen between the fins 5, $5p$, $5n$ and the hot pipes 8, thus making it possible to avoid a heat exchange by radiation between these different elements. Said plate consists, for example, of a sandwich material associating elastomer and thermal insulator. It will notably be able to be a two-layer material comprising an elastomer layer 55 on the fin side 5 and an insulating layer 56 on the hot pipe side 8.

Figure 6A:
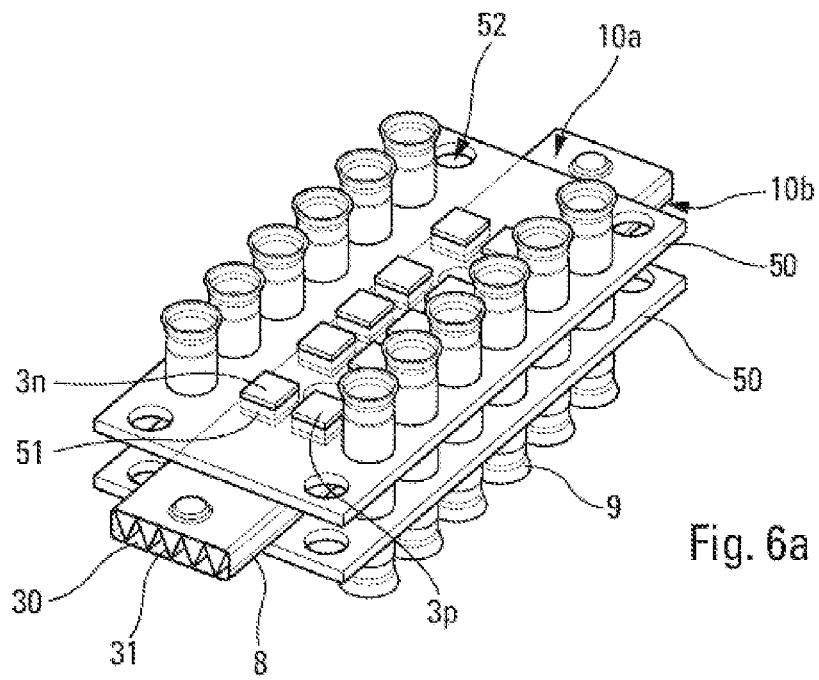
Figure 6B:
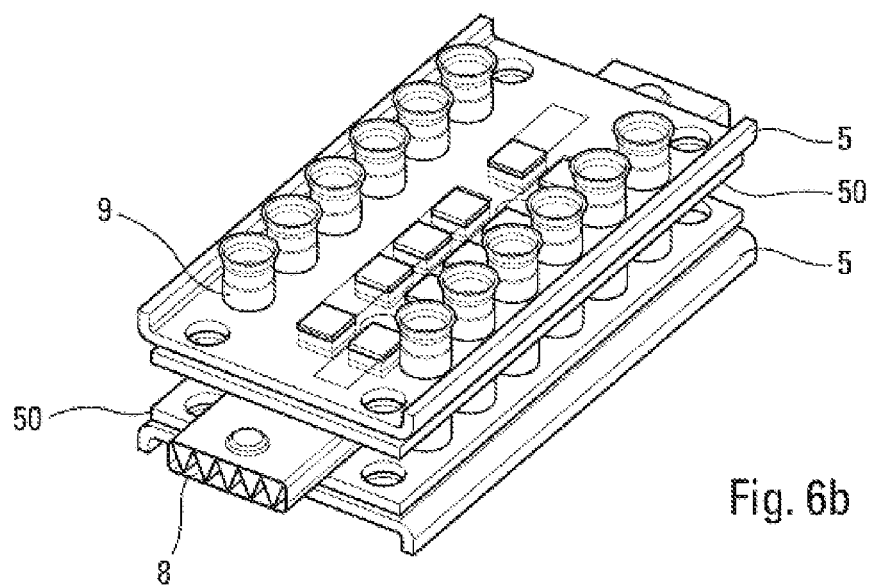

As illustrated in FIGS. 6a and 6b, one said mounting support 50, previously equipped with said thermoelectric elements 3p, 3n, one said hot pipe 8, one said mounting support 50, previously equipped with said thermoelectric elements 3p, 3n and one or more said fins 5 are stacked. For this, it will be possible to use cold pipes 9.

More specifically, as illustrated in FIG. 6a, the mounting supports 50, provided with orifices 52 for the passage of said cold pipes 9, are threaded thereon, one said hot pipe 8 being inserted between them. Then, as illustrated in FIG. 6b, a fin 5 is threaded onto the cold pipes 9, facing the support elements 50.

To obtain a complete stack, such as that described in FIG. 5 (the mounting supports 50 not being illustrated in this figure in the interests of simplifying the illustration), the stacking operation described above is repeated as many times as necessary. The stacking will be able to be terminated on either side by one said fin 5.

Two said fins 5 are, for example, provided between each said mounting support 50, previously equipped with said thermoelectric elements, and a compressible material 33 is arranged between said two fins.

After the construction of the stack, said cold pipes 9 being inserted into said passage orifices 12, 52, the pipes 9 and the fins 5 are assembled by mechanical assembly. The desired compression is thus obtained.

Mechanical assembly should be understood to mean an assembly, similar to that used in the field of heat exchangers, called mechanical, in which a radial expansion of the pipes is produced, notably by passing an expansion olive through the latter, making it possible to produce a crimping of the fins on the pipes.

It will then be possible to connect the hot pipes 8 and/or the cold pipes 9 to collecting boxes, not represented. The electrical links, notably between the fins 5, are also provided.

For the devices with cold side and hot side fins, it will also be possible to proceed by repeatedly stacking a cold side fin, a support element and a hot side fin then assembling the hot side fins with pipes for the circulation of the first fluid and the cold side fins with pipes for the circulation of the second fluid, the assembly taking place mechanically.

The invention claimed is:

1. A method for manufacturing a thermoelectric device, comprising providing a first circuit, called hot circuit, comprising pipes, called hot pipes, through which a first fluid can flow, and providing a second circuit, called cold circuit, through which a second fluid can flow at a temperature lower than that of the first fluid, providing elements, called thermoelectric elements, that can be used to generate an electric current in the presence of a temperature gradient, and providing fins in a heat exchange relationship with at least one of said hot circuit and said cold circuit, contacting the thermoelectric elements at least with said fins, arranging the fins substantially parallel to planar faces of the hot pipes, and compressing the fins in order to ensure that said thermoelectric elements are held against said fins.

2. The method as claimed in claim 1, including holding said thermoelectric elements between said hot pipes and said fins.

3. The method as claimed in claim 2, positioning the thermoelectric elements on a mounting support, then positioning said mounting support relative to said hot pipes.

4. The method as claimed in claim 3, in which one said hot pipe, one said mounting support, previously equipped with said thermoelectric elements, and stacking repeatedly one or more said fins and one said mounting support, previously equipped with said thermoelectric elements.

5. The method as claimed in claim 4, providing two of said fins between each said mounting support, previously equipped with said thermoelectric elements, and arranging a compressible material is between said two fins.

6. The method as claimed in claim 5, in which the cold circuit comprising pipes, called cold pipes, for the circulation of the second fluid, orifices for the passage of the cold pipes are provided in the fins, introducing said cold pipes into said passage orifices, and the pipes and the fins are assembled by mechanical assembly.

7. The method as claimed in claim 6, stacking the fins on the cold pipes.

8. The method as claimed in claim 4, in which the cold circuit comprising pipes, called cold pipes, for the circulation of the second fluid, orifices for the passage of the cold pipes are provided in the fins, introducing said cold pipes into said passage orifices, and assembling the pipes and the fins by mechanical assembly.

9. The method as claimed in claim 8, stacking the fins on the cold pipes.

10. The method as claimed in claim 3, in which the cold circuit comprising pipes, called cold pipes, for the circulation of the second fluid, orifices for the passage of the cold pipes are provided in the fins, introducing said cold pipes into said passage orifices, and assembling the pipes and the fins by mechanical assembly.

11. The method as claimed in claim 10, stacking the fins on the cold pipes.

12. The method as claimed in claim 2, in which the cold circuit comprising pipes, called cold pipes, for the circulation of the second fluid, orifices for the passage of the cold pipes are provided in the fins, and introducing said cold pipes into said passage orifices, and assembling the pipes and the fins by mechanical assembly.

13. The method as claimed in claim 12, stacking the fins on the cold pipes.

14. The method as claimed in claim 1, in which the cold circuit comprising pipes, called cold pipes, for the circulation of the second fluid, orifices for the passage of the cold pipes are provided in the fins, and introducing said cold pipes into said passage orifices, and assembling the pipes and the fins by mechanical assembly.

15. The method as claimed in claim 14, stacking the fins on the cold pipes.

* * * * *